United States Patent [19]

Chen

[11] 4,111,726

[45] Sep. 5, 1978

[54] BIPOLAR INTEGRATED CIRCUIT PROCESS BY SEPARATELY FORMING ACTIVE AND INACTIVE BASE REGIONS

[75] Inventor: Chau-Shiong Chen, San Diego, Calif.

[73] Assignee: Burroughs Corporation, Detroit, Mich.

[21] Appl. No.: 783,562

[22] Filed: Apr. 1, 1977

[51] Int. Cl.² .......................................... H01L 21/265
[52] U.S. Cl. .................................... 148/175; 148/1.5; 357/34; 357/91
[58] Field of Search ................... 148/175, 1.5; 357/91, 357/34

[56] References Cited

U.S. PATENT DOCUMENTS

| 3,725,150 | 4/1973 | George | 148/187 |
|---|---|---|---|
| 3,753,807 | 8/1973 | Hoare | 148/188 |
| 3,933,528 | 1/1976 | Sloan, Jr. | 148/1.5 |
| 4,032,957 | 6/1977 | Yagi et al. | 357/37 |

OTHER PUBLICATIONS

J. A. Archer, "Improved Microwave Transistor Structure", Electronics Letts., Oct. 1972, 499.

J. A. Archer, "Low Noise Implanted-Base Microwave Transistors," Solid St. Electr. 17 (1974) 387.

*Primary Examiner*—R. Dean
*Assistant Examiner*—Upendra Roy
*Attorney, Agent, or Firm*—Joseph R. Dwyer; Mervyn L. Young; Kevin R. Peterson

[57] ABSTRACT

An improved method for forming a semiconductor integrated circuit device wherein the active base area of a transistor formed therein is controlled by first forming the inactive base area and later forming the active base area, after the emitter has been formed, thus assuring the desired control over the current gain of the transistor. The separate steps of forming the inactive base area apart from the active base area eliminates the dependency of the inactive base area on the active base area so that the resistance of the inactive base area, which affects the speed of the circuit device, can be independently selected. Additionally disclosed is a method of forming the semiconductor device by a self-aligning mask technique reducing the number of critical masks and eliminating attendant alignment problems.

5 Claims, 13 Drawing Figures

BIPOLAR INTEGRATED CIRCUIT PROCESS BY SEPARATELY FORMING ACTIVE AND INACTIVE BASE REGIONS

BACKGROUND OF THE INVENTION

This invention relates generally to the fabrication to semiconductor devices and, in particular, to a process for fabricating integrated circuits having transistors whose current gains are carefully controlled.

This invention also relates, in particular, to a process for fabricating integrated circuits utilizing a master masking self-aligning technique so that the speed of operation and performance characteristics of the device may be improved.

Fabricating integrated circuits includes forming an epitaxial layer of a relatively uniform impurity concentration on the entire surface of a substrate and then forming areas such as base areas, emitter areas and collector areas, etc. in the epitaxial layer during subsequent processing.

Known prior art processes have formed a buried collector area in the epitaxial layer, formed the base area in the epitaxial layer above the collector area and then formed the emitter area in the base area thus forming an NPN type transistor. In structures formed by such processes, the size of the emitter area is smaller than the base area and the "active" base area constitutes that part of the base layer which lies between the emitter and the collector, i.e., that part of the base layer immediately below the emitter while the remainder of the base layer surrounding the emitter constitutes the "inactive" base area.

Since the thickness of the active base area and the number of impurities therein have a first order effect on the gain of a bipolar device, ion-implantation has been utilized as a means of introducing a well-controlled number of impurities forming the base. The real problem has been found to be the fact that, when the emitter is formed prior to the base, the high temperature required to anneal the damage produced by the introduction of the emitter impurities, not only moves the emitter-base junction downwardly, i.e., towards the substrate but also causes the base-collector junction to move downwardly in a direction away from the emitter-base junction. Thus, it is apparent that attempts to control the transistor gain are lost because of the loss of control of the active base width.

Too, with prior art attempts to control the current gain of a bipolar device by the selection of the number of impurities to be implanted, or diffused, to form the base, it was found that the resistance of the inactive base area could not be controlled with a result that inactive base resistance was increased thus slowing the operation of the bipolar device down.

It is, therefore, one object of this invention to provide a process for fabricating integrated circuit devices with improved control of the gain of transistors therein.

It is, therefore, still another object of this invention to provide a process for fabricating integrated circuit devices with improved control of the speed of the transistors therein.

As an important part of the process in which the foregoing control of the transistor gain is accomplished, is a self-aligning mask technique in which all of the openings or windows for a complete integrated circuit semiconductor, such as the isolation region, the base and the emitter areas, resistor areas, etc. are defined and thereafter this mask is utilized throughout the entire process. This eliminates the masking alignment problems where several critical masks are used as in the prior art and eliminates possible defects incurred by high temperature oxidation.

Therefore, it can be said that another object to this invention is to provide a new and improved process of making an integrated circuit in which a self-aligned master mask is utilized to define all of the components of the circuit on which all other subsequent processing steps are based but without additional critical masks since all the critical dimensions are defined by the original master mask.

SUMMARY OF THE INVENTION

The invention which meets the first of the foregoing objects in the processing semiconductor devices to control transistor gain and in which the conventional substrate with a collector layer have been deposited thereon and an epitaxial layer formed thereover, comprises:

First, depositing, by any selected method impurities to form an inactive base layer to a predetermined depth while having the emitter defined by masking an area located totally within the inactive base layer's lateral boundaries.

Secondly, after removing the mask of the emitter and collector area, depositing, by any selected method, impurities to form the emitter area to a predetermined depth within the inactive base and annealing the area to cure the damage caused by the introduction of the emitter impurities, and finally, forming the active base area below the emitter area by ion implantation through the emitter area and annealing the implanted impurities to activate the impurity atoms on the active base area.

Inasmuch as the annealing of the active base area is at a low temperature, the junction between the base and the emitter remains stationary with the consequent control the the active base area and a control of the current gain of the transistor cell.

It can be seen that, with the separation of the active base area and the inactive base area in the formation of the transistor, in addition to totally controlling the gain of the transistor, the resistance of the inactive base can be independently controlled for decreased resistance and increased transistor speed.

While the foregoing three steps in forming the transistor cell active base area are, in reality, the final steps in the overall process of forming the circuit components of the semiconductor device, the self-aligning mask technique which aided in arriving at these steps, or perhaps stated more correctly, the immediate selection and definition of the emitter and collector areas at the outset, is also important in this invention. This process comprises briefly, the growing of a thin silicon dioxide layer on the surface of the epitaxial layer of a conventionally formed substrate, and depositing a layer of nitride on this thin oxide layer. On top of this nitride layer, if the plasma technique is not to be utilized, an additional layer of CVD vapox is deposited to be used as the masking material. Utilizing this last layer as the master mask, all the components that make up the integrated circuit be defined, for example, the isolation regions, the base areas, the emitter and resistors areas, etc. Stated another way, the entire semiconductor wafer is made with this one mask and thereafter, all other steps in the process use this mask as the master so that all problems of alignment of other masks are eliminated.

In this process, the prior art high temperature oxidation step is omitted and thus the chance of defect occurring during the oxidation step is reduced and, too, the wash emitter process can be preserved.

BRIEF DESCRIPTION OF THE PREFERRED EMBODIMENT

Figure 1:
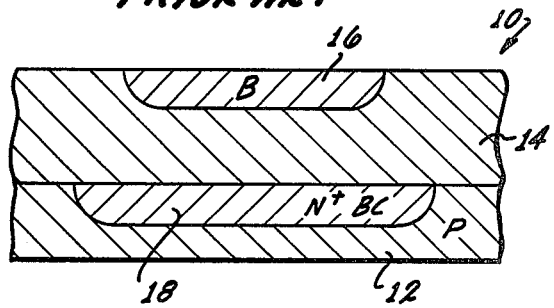
FIGS. 1 and 2 show in cross-section the semiconductor wafer as it appears after fabrication according to the prior art.
Figure 2:
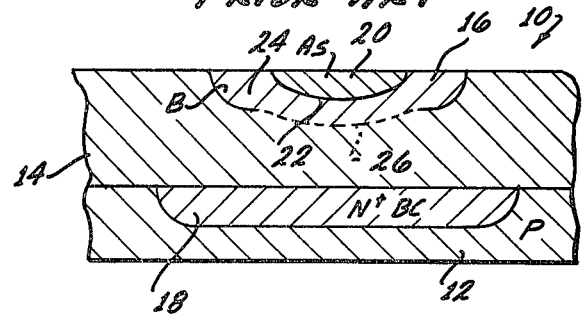

Turning first to the prior art depicted in FIGS. 1 and 2 and the problem of control of the active base area, a portion of an integrated circuit NPN transistor 10 is shown as having a substrate 12 of a P-type material of the conventional type with the epitaxial layer 14 of the N-type grown thereon with a P-type base layer 16 formed in the epitaxial layer 14 in any of the conventional methods, such as by diffusion or ion implantation, burying a collector layer 18 of the N+type, and with an N-type emitter layer 20 (FIG. 2) formed within the base layer by any of the aforesaid conventional methods. Conventionally, the emitter layer is made up of arsenic or (P) impurity atoms formed within the base layer of boron with the base layer immediately below the emitter layer being the active base area, as indicated at 22, and the remaining area 24 surrounding the emitter constituting the inactive base area. Conventionally, during the introduction of the emitter impurity atoms, the movement of the two junctions are involved. This is schematically shown by the dotted line 26. Thus, precise control of the depth of the emitter and the area forming the active base, the consequent control of transistor gain, was lost because movement of two junctions are involved.

Too, in order to control the gain of the transistor which is effected by the active base area, the inactive base area is improved with the result that the resistance of the inactive base area is high thus lessening the speed of the device.

Figure 3:
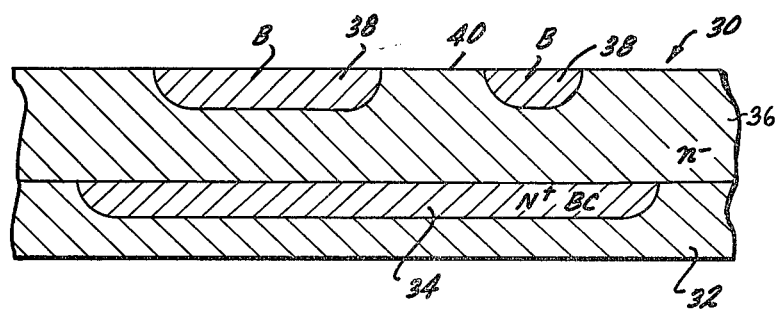
FIGS. 3, 4 and 5 show a cross-section of a semiconductor wafer as it appears after fabrication in accordance with the teachings of this invention.
Figure 4:
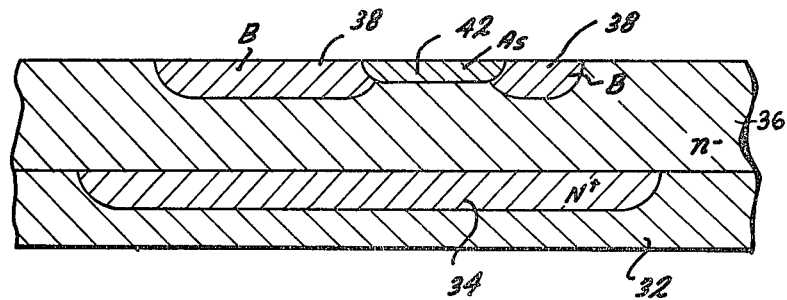
Figure 5:
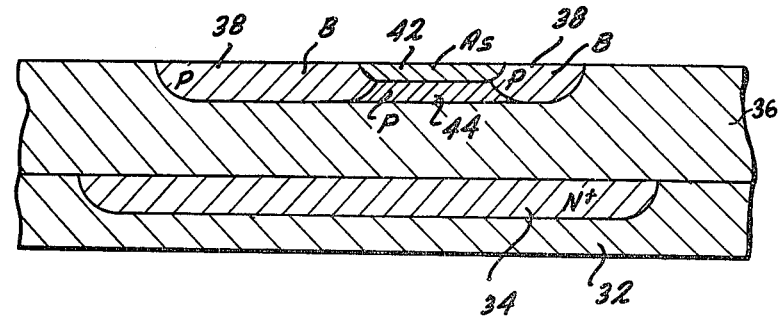

Turning now to FIGS. 3, 4 and 5 where the first aspect of the preferred embodiment of the invention is shown as steps of fabricating the active base area in order to control the gain (Hfe) of transistor 30. For the sake of simplicity all masking has been omitted. In FIG. 3, the conventional substrate 32 is shown with a buried collector 34 beneath the epitaxial layer 36. This configuration differs from the prior art in that the base layer 38 surrounds a central area 40, i.e., an area totally within the lateral boundaries of the base area, formed by masking this central area at the time of forming the base layer to provide for the emitter and active base to be formed later in this central area.

In the next step, as shown in FIG. 4, an emitter 42 is formed of arsenic ions implanted or diffused in the central portion 40 surrounded between the active base area, i.e., centrally of the base area, and in the conventional manner these arsenic ions are annealed to cure the damage caused by the introduction of the emitter impurities at a temperature of 1000° C or above. Of course, at this time, the active base area is not present.

Turning now to the next step in the process as shown in FIG. 5 and, utilizing the same mask, the active base layer 44 is ion-implanted below the emitter 42, i.e., by ion-implantation through the emitter area. Conventionally, the ion-implantation effectively controls a number of ions and the depth of the layer and it is important to point out that while the depth of the active base area is shown to be at the same depth as the inactive base area on this FIG. 5, this alignment of depth is not necessary to this invention.

Thereafter, in the next step, the active base area is annealed to activate the impurity atoms in this area but at a much lower temperature, 900° – 925° C, than required to anneal the arsenic ions. As a result, the junction between the emitter and the active base and the epi-layer is not disturbed. This affords a precise control of the transistor gain.

It can also be seen that the active base implantation is separate from the formation of the inactive base area and so that the active base resistivity is independent of the inactive base resistivity and thus the inactive base resistance can be decreased substantially with increased transistor speed resulting.

Figure 13:
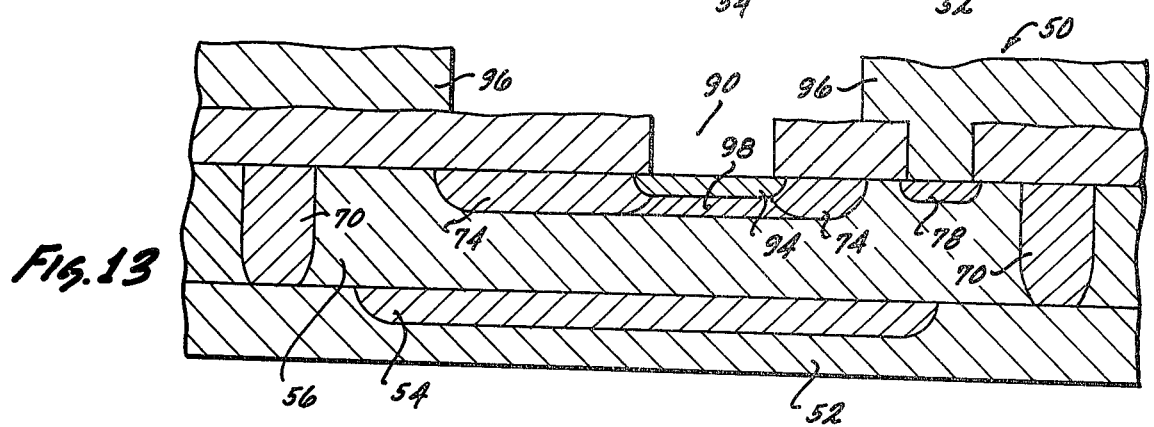

As herein before mentioned, the foregoing steps for forming the transistor cell and the control over transistor gain and base resistance are but part of a process of forming the entire integrated circuit — the process disclosed in FIG. 5 being part of the step shown in FIG. 13 to be described.

Figure 6:
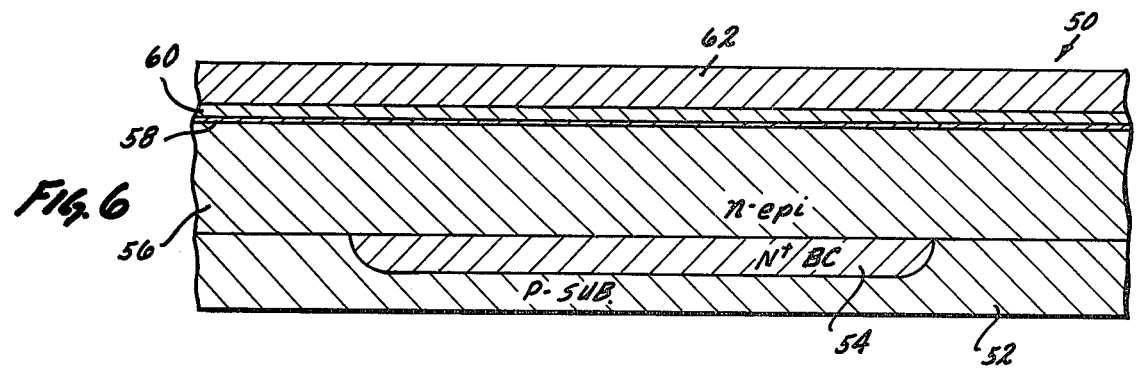
FIGS. 6 through 13 show a cross-section of a semiconductor wafer as it appears after successive processing steps performed on a semiconductor wafer — FIG. 13 being the step which corresponds to the step shown in FIG. 5.

Now turning to FIG. 6 of the illustrated embodiment of this invention where there is shown the beginnings of an NPN transistor cell 50 on a semiconductor wafer having a conventional P-type substrate 52 including an N-type buried collector 54 diffused through oxide windows in a conventional photo resist operation. An N-type epitaxial layer 56 is then grown on the top of the substrate to bury the collector in a conventional manner. Thus far, the P-substrate and buried collector with the epitaxial layer grown thereover is the same as that shown in FIGS. 1 through 5 supra and it is after these conventional steps in the process that the self-aligning masking technique comprising this invention is performed.

As shown in FIG. 6, a thin silicon dioxide layer 58, 200 angstroms thick, is thermally grown on the surface of the epitaxial layer 56 and thereafter a layer 60 of CVD nitride 1.0K angstroms thick is deposited on this oxide layer. Finally, if the plasma technique is not selected to be used, a low temperature CVD vapox layer 62, 4K angstroms thick, is deposited on the nitride layer 60 to be used as a masking material during the chemical nitride etch. Thus formed, the wafers are then heat treated to densify the CVD glass and a P-gettering technique is performed on the back side of the wafer at this same time. It is important to note here that this low temperature Vapox and nitride used in the masking step eliminates the high temperature oxidation step and thus a chance of defects growing during oxidation are reduced. Also, P-gettering, which is normally omitted in the process, is introduced into the process before any critical steps such as the introduction of the base and emitter impurity atoms if As impurity atoms are used as emitter dopants.

Figure 7:
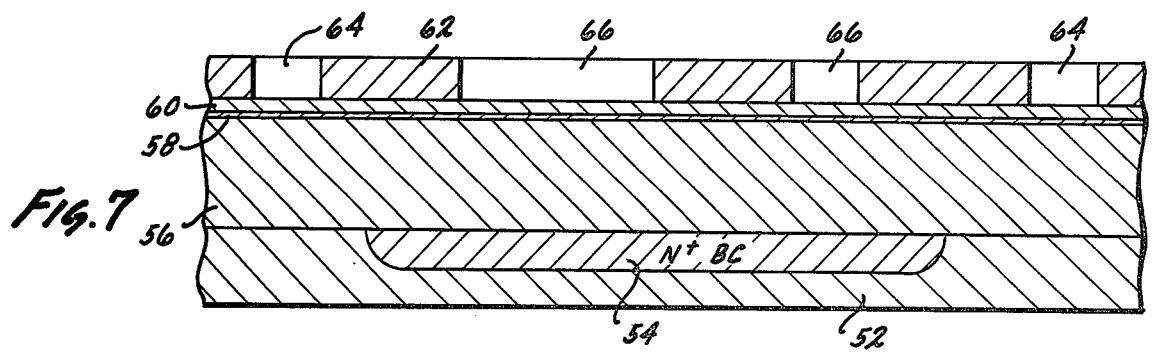

The next step, depicted in FIG. 7, is the formation of the windows 64 and 66 for the isolation region and the inactive base area, respectively, by chemical etching of the vapox layer 62 leaving the 1K angstrom nitride layer 60 and leaving the silicon dioxide 58 intact.

In connection with this particular step, attention is directed to the fact that this step is the formation of the master mask which is the definition of all of the elements in the wafer including not only the aforementioned windows 64 and 66 for the isolation region and the inactive base area but also the additional areas for other components, such as emitter and resistors, etc. It is the selection of the emitter and collector areas at the outset that is important since this has never been done before and this differs from the present day techniques in that this mask alone defines the electronic components of the circuit without additional masking. This eliminates alignment problems and permits a more precise definition of the components since no tolerance in the basic mask is required to compensate for alignment tolerances in latter masking processes.

Figure 8:
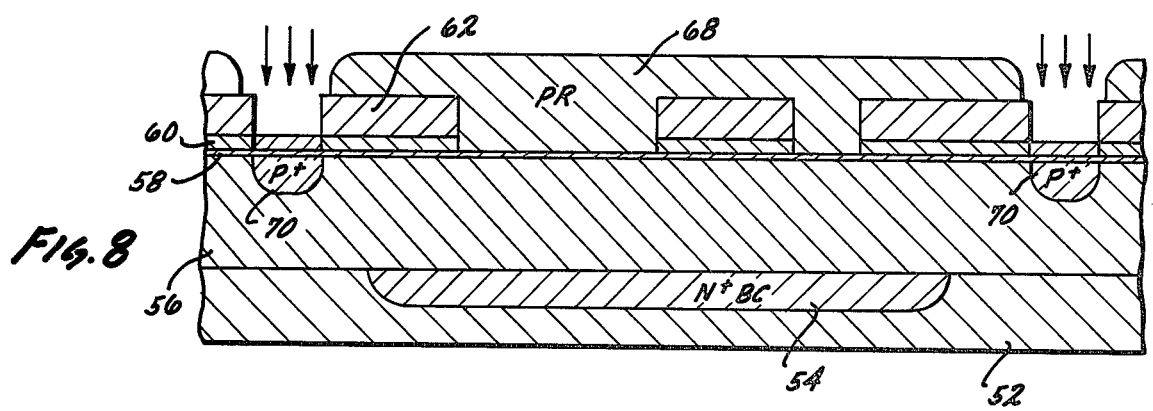

After the windows have been defined as shown in FIG. 7, a photoresist mask 68, such is shown in FIG. 8, is deposited over the inactive base windows 66 leaving the isolation windows 64 open. If the P-isolation region is to be performed by ion-implantation, the layers 58 and 60 can remain, such as shown in FIG. 8 and the P-type dopant atoms can be implanted through these layers to a predetermined depth such as shown at 70. On the other hand, if the isolation region is to be performed by diffusion, the layers 58 and 60 below or in the windows 64 can be removed and a diffusion process utilized to form the isolation region to a predetermined depth as shown at 70 in FIG. 8. In either case, the layer of diffused or ion-implanted P-type dopants forming the isolation region, is annealed or driven into the epitaxial layer to form a complete isolation larger such as shown in FIG. 9.

Figure 9:
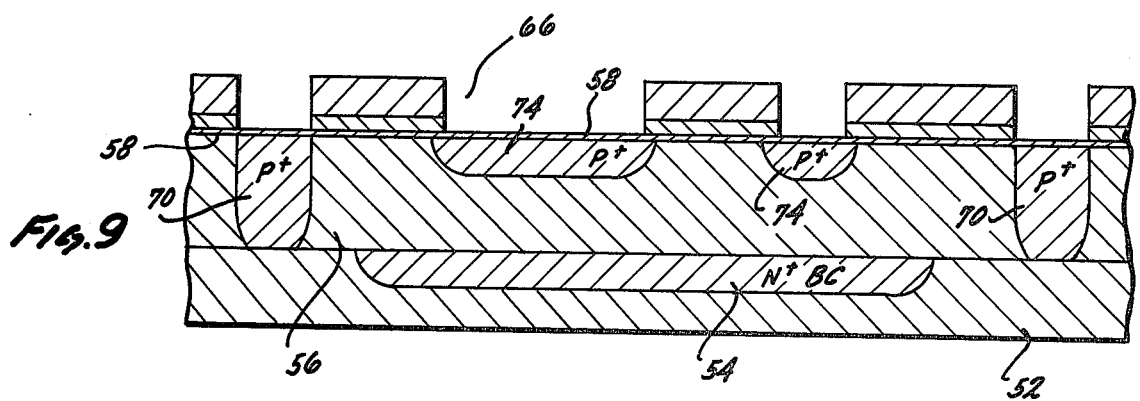

Still considering FIG. 9, in the next step, the photoresist covering 68 is removed so as to expose windows 66 and P-type dopant is either diffused or ion-implanted into the window 66 to a depth such as shown at 74. If a diffusion technique is used, layer 58 is removed, but ion-implantation can take place through layer 58 and therefore it can remain for this latter technique. It is important to note here that the resistivity of this inactive base area can be varied to fit circuit requirements; an important distinction of this invention over the prior art as mentioned above.

Figure 10:
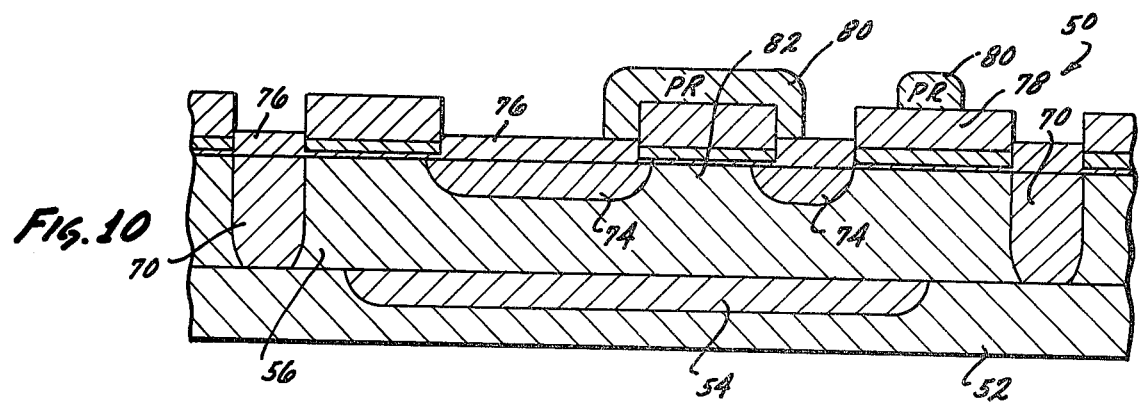

Thereafter, as shown in FIG. 10, a silicon dioxide layer 76 is thermally regrown over the isolation areas as shown. This layer is approximately 700 angstroms thick.

It can be seen in FIG. 10 that the collector area is now defined by covering the area 78 and likewise the emitter area, previously defined by window 66 with a photoresist material 80.

Figure 11:
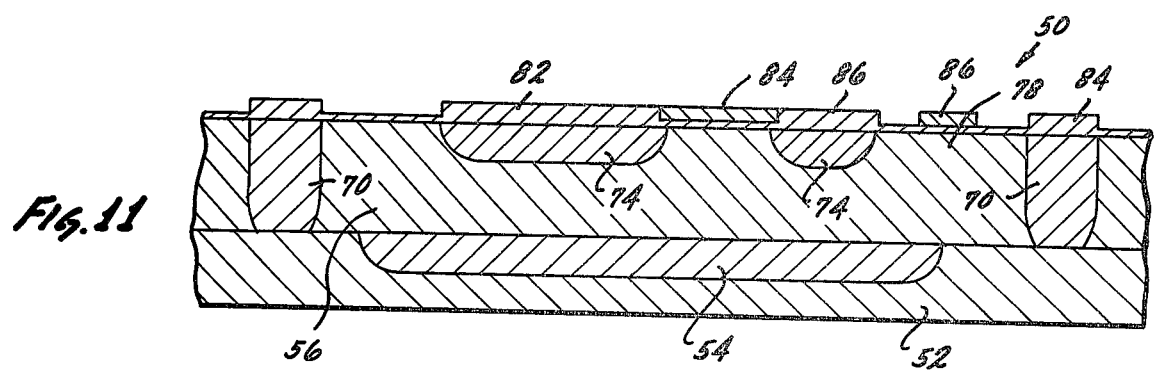
Figure 12:
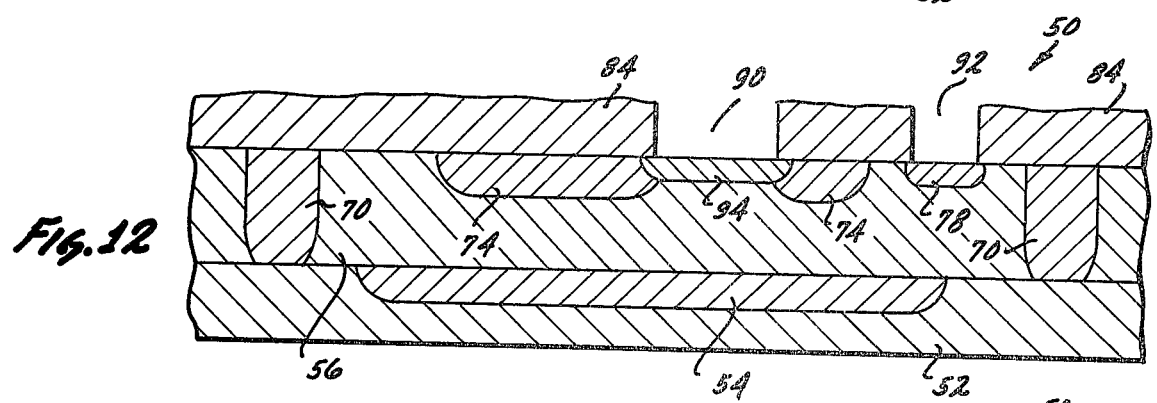

After the emitter has been covered and the collector area defined by the photoresist material, and after all other material has been removed, a layer of silicon dioxide 84, about 4K angstroms thick, is thermally regrown back over the inactive base area and the remainder of the integrated circuit with the exception of the collector and emitter areas which are covered with a thin layer, nitride layer 86, as shown in FIGS. 11 and 12.

Thereafter, the thin layer of nitride 86 is removed from the emitter and collector areas and windows 90 and 92 as thus formed by the silicon dioxide layer 84.

Arsenic impurity atoms are then introduced through windows 90 and 92 to form the emitter and collector areas using the 4K angstroms silicon dioxide 84 as a mask and the emitter-base junction 94 is then determined by the annealing cycle.

Thereafter, as shown in FIG. 13, a photoresist material 96 is covered over the collector area 78 and the active base P-type dopant impurity atoms are then implanted through the same window 90, to provide the active base area aforesaid and the area is annealed to activate the atoms. Again, while the active base is shown at a depth coplanar with the inactive base area, such alignment of depth is not necessary.

From the foregoing, it can be seen that the disclosed process offers an improved control of transistor gain by a control of the active base layer and the utilization of a master masking self-aligning technique offers better definition of the various components of the wafer. It would be clear but it is again worth mentioning that the original definition of the inactive base area and concomitant selection of the emitter and active base area contributes to the self-alignment. — Note windows 66 of the step of FIG. 7 are positioned and carried forward to the step of FIG. 13 since they not only define the base area but also the emitter area. Further, while no disclosure was made of the addition of the metallic contacts and interconnections to the wafer, it is obvious that these can be provided in the conventional manner on the surface of the wafer with a suitable patterning extending into ohmic areas.

What is claimed is:

1. In a method for fabricating a transistor in a semiconductor integrated circuit device having a substrate of a semiconductor material of a first conductivity type, a first layer of a second conductivity type and an epitaxial layer of the second conductivity type over the entire surface of the substrate burying said first layer;

the improvement comprising the steps of:
providing a silicon dioxide layer on the surface of the epitaxial layer,
depositing a layer of nitride on the oxide layer,
depositing a mask material over the nitride layer,
heat treating the device to densify the masking material,
forming openings in the mask material leaving the nitride and silicon dioxide layers intact, the center area of one of the openings remaining covered with the mask material thus selecting the emitter area and the isolation areas;
forming isolation areas through the nitride layer within the epitaxial area of the first conductivity type while said one of said areas and said center area are covered with a photoresist material,
forming a second layer of the first conductivity type to a predetermined depth through the nitride layer within the epitaxial layer while having said masked center area to prevent said second layer being formed in said area to form an inactive base surrounding the emitter area;
removing the mask material from the central area and forming a third layer of a second conductivity type to a predetermined depth within the laterial dimensions of the second layer to form an emitter;
and forming beneath the third layer by implantation through said third layer, a fourth layer of the first conductivity type lateral coextensive with the third layer and contiguous with the second layer to form an active base area.

2. The method as claimed in claim 1 wherein the formation of the second layer of the first type comprises depositing P-type impurities to form the inactive base layer.

3. The method as claimed in claim 1 wherein the third layer of the second conductivity type comprises depositing N-type impurities to form the emitter.

4. The method as claimed in claim 1 wherein the formation of said fourth layer of the first conductivity type comprises implanting P-type impurities through the emitter area.

5. The method as claimed in claim 4 wherein said emitter area is annealed before the implantation of P-type impurities therethrough.

* * * * *